United States Patent [19]

Ibata et al.

[11] 4,214,026

[45] Jul. 22, 1980

[54] SHEET MOLDING MATERIAL

[75] Inventors: Jyoji Ibata, Fuji; Hisaaki Fukui, Nobeoka; Takeo Yuasa; Michio Katoh, both of Fuji, all of Japan

[73] Assignee: Asahi Kasei Kogyo Kabushiki Kaisha, Osaka, Japan

[21] Appl. No.: 936,551

[22] Filed: Aug. 24, 1978

[51] Int. Cl.² ............... B32B 13/12; B32B 27/36; B32B 27/38
[52] U.S. Cl. ................... 428/67; 156/244.17; 156/272; 428/75; 428/175; 428/228; 428/232; 428/237; 428/247; 428/251; 428/256; 428/268; 428/283; 428/302; 428/323; 428/457; 428/458; 428/913
[58] Field of Search .............. 428/457, 458, 67, 74, 428/75, 175, 228, 232, 237, 240, 247, 251, 256, 268, 283, 288, 295, 302, 323, 901, 913; 156/244.17, 272

[56] References Cited

U.S. PATENT DOCUMENTS

| | | | |
|---|---|---|---|
| 2,949,380 | 8/1960 | Stuart | 428/457 X |
| 3,527,665 | 9/1970 | Wright et al. | 428/457 X |
| 3,625,745 | 12/1971 | Wright et al. | 428/457 X |
| 3,975,561 | 8/1976 | Knudson et al. | 428/67 |
| 4,054,710 | 10/1977 | Botsolas | 428/228 |
| 4,054,711 | 10/1977 | Botsolas | 428/457 X |
| 4,064,296 | 12/1977 | Bornstein et al. | 156/244.17 X |
| 4,130,686 | 12/1978 | Takahashi et al. | 428/295 X |
| 4,135,826 | 1/1979 | Holm | 74/61 X |

*Primary Examiner*—Harold Ansher
*Attorney, Agent, or Firm*—Sughrue, Rothwell, Mion, Zinn and Macpeak

[57] ABSTRACT

A sheet molding material comprising (1) an interlayer containing a photopolymerizable resin and a photocuring agent for the photopolymerizable resin, and (2) a surface layer of a thermosetting resin containing a heat curing agent for the thermosetting resin on both surfaces of the interlayer (1); and a process for the production of the sheet molding material.

43 Claims, No Drawings

SHEET MOLDING MATERIAL

BACKGROUND OF THE INVENTION

1. Field of the Invention

This invention relates to a sheet molding material of a thermosetting resin and, more particularly, to a three-layer sheet molding material, and to a process for its production.

2. Description of the Prior Art

Known conventional sheet molding materials of a thermosetting resin include "sheet molding compounds" (hereinafter, "SMC" for brevity) obtained from a mixture of a liquid unsaturated polyester resin and glass fibers, inorganic filler, etc., which is thickened with magnesium oxide, etc., and thin prepregs obtained by impregnating a substrate such as paper or glass cloth with a phenolic resin or an epoxy resin.

With SMC's, it is extremely difficult to obtain a flat plate whose thickness is quite accurate because the amount of flow of the resin is great at the time of molding. Accordingly, a special mold is required, and only one plate can be produced at a time. In addition, glass fibers are oriented to a marked extent in the direction of the flow of the resin, and, therefore, directionality occurs in the mechanical properties or dimensional accuracy. Consequently, dimensional changes such as warping (laterally) or twisting (corner to corner) tends to occur in the cured SMC sheet. Furthermore, when a different kind of thin film, such as a decorative sheet, a film and a metal foil, is to be laminated on such a sheet, distortions and creases tend to occur in the thin film because the surface of the sheet is not smooth and is tacky. It is difficult, therefore, to laminate such a thin film during the molding of the sheet molding material. When the thin film is laminated after the sheet has been cured, adhesion of the thin film to the sheet is reduced.

In a prepreg, the resin is generally partially cured, i.e., to the B-stage, and the surface is non-tacky. With such prepregs, several hundred sheets can be produced at a time by using a multi-stage press which does not require a mold or a spacer. A copper foil or the like may be laminated, simultaneously, on the sheet and the resulting laminate is utilized as a printed circuit base board. Formation of these sheets, however, requires a lamination of five or more prepregs, and this operation is quite laborsome and has a poor efficiency. Furthermore, since several thin prepregs are laminated, deaeration in spaces between the layers is difficult, and unacceptable products with voids or poor adhesion between the layers will be formed. Production of prepregs usually involves impregnating a base material, such as paper or cloth, with a solution of a resin composition in a solvent, usually called a varnish, and evaporating the solvent. Therefore, pollution prevention measures must be taken to recover the solvent and prevent its dissipation outside the system. Since the viscosity of the varnish must be low in order to achieve good impregnation and to eliminate bubbles, a large amount of inorganic filler cannot be used, the cost of production cannot be reduced by conserving the amount of expensive resin used, and the latitude in improving the properties is narrow. Furthermore, it is very difficult to control the flowability of the resin in the prepreg when the resin is in the B-stage. When a large-size flat plate, e.g., with one side measuring 1 meter, is produced, there is a great difference in thickness between the central and edge portions of the plate. Hence, the area of the plate which must be trimmed off is large, and the yield of the product is low.

The present invention provides a sheet molding material of a thermosetting resin useful for obtaining a flat plate, which can be used to remove these disadvantages and on which different kinds of thin films can be laminated at the same time.

Some of the coinventors of the present invention found that a sheet molding material of an unsaturated polyester resin having an uncured surface layer and an interlayer having an average degree of curing of at least 50% can be press-formed without using a mold or a spacer, e.g., as disclosed in Japanese Patent Application (OPI) No. 101276/77. The present invention is an improvement over the invention disclosed in Japanese Patent Application (OPI) No. 101276/77.

SUMMARY OF THE INVENTION

An object of this invention is to provide a sheet molding material which can be molded to the desired thickness without using a mold, a spacer, etc., which has superior moldability using multi-stage press-forming, and which permits an increased efficiency of operation to be achieved.

Another object of this invention is to provide a structure of a sheet molding material which has a high degree of thickness accuracy and is suitable for continuous molding, and to provide a process for the production thereof.

Still another object of this invention is to provide a sheet molding material on which different kinds of thin films can be laminated, and which can be formed into a molded sheet having a high level of dimensional stability.

Accordingly, the present invention in one embodiment provides a sheet molding material comprising (1) an interlayer containing a photopolymerizable resin and a photocuring agent for the photopolymerizable resin; and (2) a surface layer of a thermosetting resin containing a heat curing agent for the thermosetting resin on both surfaces of the interlayer (1).

The present invention in another embodiment provides a sheet molding material as described above in which only the interlayer (1) has been cured by irradiation with light and both surface layers (2) remain in an uncured state.

In a further embodiment, the invention provides a sheet molding material as described above where the surface layers (2) additionally contain a continuous-phase base material.

In an even further embodiment, the invention provides a sheet molding material as described above where a metal layer is further laminated on at least one of the surface layers (2).

In another further embodiment of the present invention, the present invention provides a process for continuously producing the sheet molding material as described above, which comprises extruding a composition containing a photopolymerizable resin and a photocuring agent for the photopolymerizable resin as the interlayer (1), using an extruder and a sheet die, adhering a surface layer of a thermosetting resin containing a heat curing agent for the thermosetting resin to both surfaces of the interlayer (1) to form surface layers (2) thereon, and irradiating the assembly with light to cure the interlayer (1).

DETAILED DESCRIPTION OF THE INVENTION

When the sheet molding material of this invention described above is exposed to light, only the interlayer (1) containing a photocuring agent and a photopolymerizable resin is cured, and both surface layers (2) which do not contain a photocuring agent necessarily remain uncured. Thus, the sheet molding material does not require the complicated conditions for use described in Japanese Patent Application (OPI) No. 101276/77, such as the thickness of the sheet, the use of a special photocuring agent, the proportions of the photocuring agent, the heat curing agent and inorganic filler, and the temperature and the concentration of oxygen in the atmosphere at the time of photocuring.

Any combinations of photocuring agents and photopolymerizable resins which will be activated by light and polymerized can be used as the interlayer (1). Other additives, for example, short fibers which are a reinforcing material and serve to control flowability; inorganic fillers for low shrinkage, cost reduction, and impact strength; fire retardants; thermosetting resins; thermoplastic resins for inhibiting shrinkage; and thickeners for flow control; can also be employed in the interlayer (1) in amounts which do not impair photocuring.

The thickness of the interlayer (1) is limited only by the ability to permit transmission of light. For example, a composition for the interlayer which does not contain the various additives described above and permits a good transmission of light of the wavelength required for curing can be formed into a layer having a thickness of up to about 30 mm, more generally, 0.5 mm to 10 mm or more.

Photopolymerizable resins used in the interlayer (1) in this invention are resins which polymerize due to the action of a photocuring agent to form a three-dimensional network structure. Suitable photopolymerizable resins which can be used include resins conventionally used as a so-called photopolymer comprising photopolymerizable prepolymers, oligomers and monomers.

Suitable examples of photopolymerizable resins which can be used are disclosed in U.S. Pat. Nos. 2,875,047, 3,029,145, 3,101,270, 2,927,022, 2,902,365, 2,946,611, 3,024,180, 2,929,710, 2,972,540, 2,760,863 and 3,031,301. Suitable examples of photopolymerizable prepolymers, oligomers and monomers are disclosed in *Chem. Rev.*, 68, 125 (1968), G. Oster, *Encyclopedia of Polymer Science and Technology*, Vol. 10, p. 145, Interscience (1969), J. Kosar, *Light-Sensitive Systems:* Chemistry and Application of Non-Silver Halide Photographic Processes, John Wiley & Sons. Inc., (1965), and G. Nagamatsu, *Photosensitive Polymers,* Kodansha (1977).

Specific examples of suitable photopolymerizable prepolymers or oligomers are unsaturated polyesters, epoxy resins, unsaturated epoxy resins, unsaturated polyurethanes, polyvinyl cinnamate, unsaturated polyvinyl alcohol, unsaturated polyamides, unsaturated silicone resins, resins resulting from the attaching of an unsaturated group to a maleic acid copolymer by an ester linkage, a ring-opening polymerization product of glycidyl methacrylate, polybutadiene, and a diallyl phthalate prepolymer.

More specifically, suitable unsaturated polyesters which can be employed comprise ester polycondensates of unsaturated acids, such as fumaric acid, maleic acid, itaconic acid, citraconic acid, and saturated acids, such as phthalic acid, isophthalic acid, terephthalic acid, endomethylene-tetrahydrophthalic anhydride, adipic acid, sebacic acid, and succinic acid with glycols, such as ethylene glycol, propylene glycol, butanediol, pentanediol, neopentyl glycol, hydrogenated bisphenol A, etc.

Suitable epoxy resins which can be employed include epoxy resins obtained by reaction of bisphenol A and epichlorohydrin, alicyclic epoxy resins, novolak-type epoxy resins, 1,2-polybutadiene epoxy resins, and the like. A suitable epoxy equivalent range for these epoxy resins ranges from about 100 to about 2,000.

Suitable unsaturated epoxy resins which can be employed include resins obtained by esterification of the above-described epoxy resins with acrylic acid or methacrylic acid.

Suitable examples of unsaturated polyurethanes which can be employed include those as described in Japanese Patent Application (OPI) No. 27801/1973 of the formula:

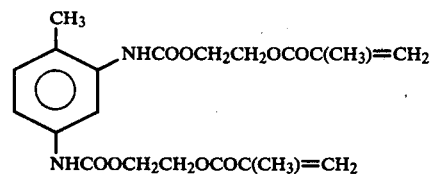

and those disclosed in Japanese Patent Publication No. 41708/1973 of the formula:

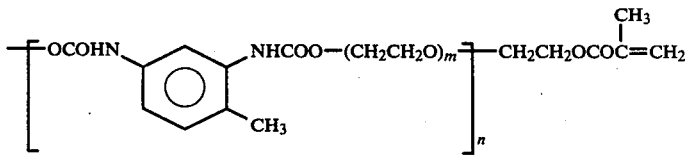

A suitable example of an unsaturated polyvinyl alcohol which can be employed is disclosed in Japanese Patent Publication No. 5923/1974 of the formula:

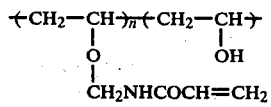

and suitable unsaturated polyamides which can be employed include those disclosed in Japanese Patent Application (OPI) No. 115541/1974 of the formula:

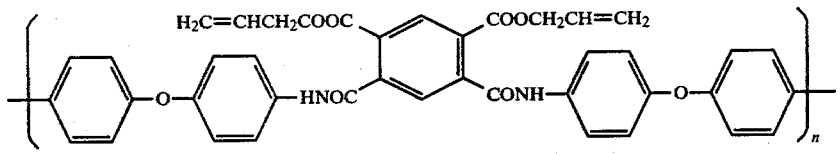

Suitable maleic acid copolymers which can be employed include that of the formula:

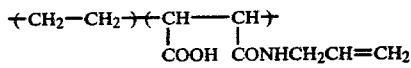

as disclosed in Japanese Patent Application (OPI) No. 82902/1973 and that of the formula:

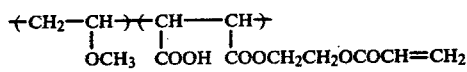

as disclosed in Japanese Patent Application (OPI) No. 37701/1974.

Suitable unsaturated silicone resins which can be employed include those having therein repeating units of the formula:

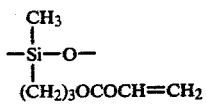

as disclosed in *Japanese Printing Society Papers*, 16, 131 (1976).

Specific examples of photopolymerizable monomers include monofunctional monomers, such as styrene, acrylonitrile, vinyl acetate, N-vinylpyrrolidone, acrylamide, acrylic acid, methacrylic acid, methyl acrylate, ethyl methacrylate, butyl acrylate, cyclohexyl acrylate, benzyl acrylate, 2-ethylhexyl acrylate, 2-hydroxyethyl methacrylate, glycidyl methacrylate, dimethyl fumarate and vinyl toluene; and polyfunctional monomers, such as ethylene glycol diacrylate, polyethylene glycol diacrylate, diethylene glycol dimethacrylate, polyethylene glycol dimethacrylate, polypropylene glycol diacrylate, polypropylene glycol dimethacrylate, 1,4-butanediol diacrylate, 1,6-hexanediol dimethacrylate, pentaerythritol diacrylate, pentaerythritol triacrylate, pentaerythritol tetraacrylate, trimethylol propane triacrylate, trimethylol propane trimethacrylate, diglycidyl phthalate dimethacrylate, a urethane compound comprising the reaction product of 2,4-tolulene diisocyanate and 2-hydroxyethyl methacrylate, diallyl phthalate, diallyl maleate, triallyl cyanurate, N,N-methylene-bis acrylamide, cyclohexanebisacrylamide, hexahydro-1,3,5-triacryl-s-triazine, and N-acryloyl hydroxyethyl maleimide.

These photopolymerizable prepolymers or oligomers and monomers can be used either individually or as a suitable combination of two or more thereof. However, a three-dimensional structure will not be formed if a monofunctional photopolymerizable monomer is used alone, although such will be photopolymerized by irradiation of light. Hence, a monofunctional photopolymerizable monomer should be used in combination with other of the photopolymerizable materials described above. Generally, suitable combinations of photopolymerizable prepolymers or oligomers with the monofunctional photopolymerizable monomers are selected.

Photocuring agents which can be used in the interlayer (1) in this invention for the photopolymerizable resins are compounds which absorb light having a wavelength of at least about 200 mµ and which induce polymerization of the photopolymerizable resin described above. Photocuring agents can be compounds which do not polymerize themselves, but are activated by absorbing light and induce polymerization. Specific examples of the photocuring agents which can be used in this invention include carbonyl containing compounds, such as benzoins, benzophenones, and nuclear quinones, e.g., benzoin, butyroin, acetoin, α-methylbenzoin, benzoin methyl ether, benzoin ethyl ether, benzoin isopropyl ether, benzoin butyl ether, diacetyl benzyl benzophenone, acetophenone, 4,4'-bis(dimethylamino)-benzophenone, 4,4'-bis(diethylamino)-benzophenone, anthraquinone, 2-methyl anthraquinone, 2-ethyl anthraquinone, 2-t-butyl anthraquinone, 1-chloroanthraquinone, 1,4-naphthoquinone, 9,10-phenanthraquinone, and Michler's ketone, azo compounds, such as azobenzoyl, organic sulfur compounds, mercapto compounds and disulfides, e.g., dibenzothiazolyl sulfide, decyl phenyl sulfide, diphenyl disulfide, dibenzyl disulfide, 2-mercaptobenzothiazole, thiophenol, and methyl diethyl dithiocarbamate, halogens and halogenated compounds, e.g., bromine and carbon tetrabromide, metal carbonyls, e.g., manganese carbonyl, inorganic compounds, e.g., tetramethyllead, tetraethyllead, zinc oxide, etc., triphenylphosphine, mixtures of the compounds described above, redox combinations such as Fe (III) and hydrogen peroxide, light-sensitive dyes, such as a combination of eosine and ascorbic acid, silver bromide, etc.

A suitable amount of the photocuring agent in the interlayer (1) is an amount of at least about 0.01 part by weight, usually 0.1 to 5 parts by weight, per 100 parts by weight of the photopolymerizable resin. If the amount of the photocuring agent is less than about 0.01 part, sufficient curing of the photopolymerizable resin in the interlayer (1) does not occur. Amounts larger than 5 parts by weight can be used but are economically undesirable. Preferably, the amount of the photopolymerizable resin in the interlayer (1) is at least about 5% by weight based on the weight of the interlayer (1). If the amount of the photopolymerizable resin is less than about 5% by weight, control of the flowability of the resin is difficult even if the photopolymerizable resin is cured by photopolymerization. Consequently, thickness accuracy after press-forming cannot be obtained.

Examples of short-fiber materials which can be used as an additive in the interlayer (1) are synthetic fibers such as polyvinyl alcohol fibers, polyester fibers, acrylic fibers, polyvinyl chloride fibers, Saran (trademark of Dow Chemical) fibers, nylon fibers, and polypropylene fibers, natural fibers such as sisal hemp and cotton, regenerated fibers such as high tenacity rayon, inorganic fibers such as boron fibers, glass fibers, asbestos fibers, and carbon fibers, metal fibers such as steel fibers, and whiskers of metals, such as Fe, Cu, Sn, Ag, of metal oxides, such as $Al_2O_3$ and of carbon. In general, suitable short-fiber materials have a length of about 3 to about 50 mm. However, after mixing and kneading with the photopolymerizable resin, a length of about 0.1 to 1 mm results.

Examples of inorganic fillers which can be present as an additive in the interlayer (1) include calcium carbonate, magnesium carbonate, barium sulfate, gypsum, alumina, aluminum hydroxide, clay, kaolin, talc, mica, silica powder, glass fiber powders (milled fibers), calcium silicate, aluminum silicate, hydrotalcite, colemanite, alum, glass beads, microspheres, fly ash, titanium dioxide, Dowsonite (trade name, produced by Alcoa), perlite, bentonite, asbestos powder, silica sand, magnesium hydroxide, dolomite and lime. A suitable particle size for these inorganic fillers ranges from about 0.1 to $100\mu$, preferably 0.5 to $20\mu$. Although it is only necessary for a combination of the photopolymerizable resin and the photocuring agent described above to be present in the interlayer of the sheet molding material of this invention, generally an inorganic filler and short-fiber materials are also employed. A suitable amount of the short-fiber material and the inorganic filler is about 5 to 30% by weight, and 10 to 80% by weight, respectively, based on the weight of the composition for the interlayer (1).

Suitable fire retardants which can be employed in the interlayer (1) include tetrabromobisphenol A, diallyl chlorendate, chlorinated polyethylene, antimony trioxide, tris($\beta$-chloroethyl) phosphate, triphenyl phosphite, tetrachlorophthalic anhydride, and tetrabromobutane. These fire retardants include addition type fire retardants which are merely incorporated into the composition for the interlayer (1) and reactive type fire retardants. A suitable amount of the fire retardants will depend upon the nature of the fire retardant used. More specifically, for halogen-containing fire retardants, about 8 to 10% by weight based on the weight of the combustible components present is suitable, for phosphorus-containing fire retardants, a suitable amount is about 5 to 6% of the combustible components present and for antimony trioxide when used in combination with a halogen-containing fire retardant, a suitable amount is about 0.1 to 2% by weight based on the combustible components present.

Further, some of the inorganic fillers described above can also be employed to achieve fire retardancy, i.e., those which form carbon dioxide or water at high temperatures such as $Al_2O_3.3H_2O$, hydrotalcite, colemanite, alum, etc. A suitable amount of these inorganic fillers which can be used to achieve fire retardancy is about 100 to 300% by weight based on the weight of the combustible components present.

Suitable thermosetting resins which can be employed in combination with the other components present in the interlayer (1) include heat curable thermosetting resins and suitable specific examples of these materials are heat curable thermosetting resins disclosed hereinafter with respect to the thermosetting resins suitable for use in the surface layers (2).

Suitable thermoplastic resins which can be employed include methylacrylate copolymers, polystyrene, saturated polyesters, polyethylene, polypropylene and acrylonitrile copolymers. A suitable amount of these materials is up to about 5% by weight based on the total weight of the composition for the interlayer (1).

Suitable thickeners for flow control which can be employed in this invention include magnesium oxide, finely divided silica (for example, Aerosil, a trademark of Nippon Aerosil Co., Ltd., $SiO_2$ fine powder; particle size: 8 m$\mu$ to 40 m$\mu$), magnesium sulfate and calcium oxide. Metal cross-linking occurs when these thickeners for flow control are employed resulting in a thickening of the compositions. A suitable amount of these thickeners which can be employed is about 0.5 to 3% by weight based on the total weight of the composition for the interlayer (1) with a suitable particle size ranging from about 0.1 to 5 microns.

When the uncured surface layers (2) are applied after the interlayer (1) has been cured by irradiation with light, care must be taken not to cause a reduction in adhesive strength between the interlayer (1) and each surface layer (2). The composition of each surface layer (2) can be selected from a wider range of materials than the composition of the interlayer (1), and different kinds of resins from the photo-polymerizable resins used in the interlayer (1) can be employed. On the other hand, when the two surface layers (2) are applied to the interlayer (1) and then the assembly is irradiated with light, the thickness and composition of each surface layer (2) is such that the transmission of light to the interlayer (1) for curing the polymerizable resin in the interlayer (1) is not impaired.

Suitable thermosetting resins which can be used in the surface layers (2) of the sheet molding material of the present invention include basically any thermosetting resins, many of which are commercially available. A suitable setting temperature for the thermosetting resins which can be employed in this invention ranges from about 50° C. to about 200° C. with the setting temperature being controllable by a combination of the thermosetting resin employed, the heat curing agent employed and whether a promoter is employed.

Specific examples of thermosetting resins which can be used in the surface layers (2) of the sheet molding material of this invention are unsaturated polyester resins, unsaturated epoxy resins, saturated epoxy resins, diallyl phthalate resins, polybutadiene, phenolic resins, and melamine resins. These thermosetting resins can be used either individually or as mixtures thereof.

The molecular weights of suitable thermosetting resins which can be employed prior to setting can vary depending upon the nature of the thermosetting resin used. More specifically, a suitable molecular weight for thermosetting epoxy resins ranges from about 350 to about 2,000, for unsaturated polyester thermosetting resins ranges from about 1,000 to about 5,000, for diallyl phthalate thermosetting resins ranges from about 3,000 to about 20,000, for melamine thermosetting resins ranges from about 500 to about 2,000, and for phenolic thermosetting resins ranges from about 1,000 to about 5,000.

It is to be pointed out that unsaturated resins are described above as being suitable for use as thermosetting resins in the surface layers (2). Suitable unsaturated epoxy resins include the reaction products of epoxy resins with acrylic acid and/or methacrylic acid. More specifically, one mol of acrylic or methacrylic acid can be addition reacted with a bisphenol-type epoxy resin having two epoxy groups in the molecule to produce the half esters thereof. When 1.5 mol of acrylic acid or methacrylic acid is reacted per mol of the epoxy group of the epoxy resin, a resin having 1.5 equivalents of unsaturated groups and 0.5 equivalents of epoxy groups per molecule is obtained. These unsaturated epoxy resins can be polymerized either by heat or by light, but are not polymerized by heat when a heat curing agent is not present or by light when a photocuring agent is not present. Thus, unsaturated epoxy resins can be both employed as the thermosetting resins in the surface layers (2) used in this invention or as photo-polymerizable resins in the interlayer (1) of this invention, their utility lying in the presence therewith of an appropriate heat curing agent or photocuring agent depending upon the positioning thereof in the sheet molding material of this invention.

Heat curing agents which can be used in the surface layers (2) of the sheet molding material of this invention are compounds which initiate reaction by heating, and cure the thermosetting resin present. A suitable amount of the heat curing agent will vary depending upon the properties, reactivity, ability to produce the desired cured polymer, etc. An appropriate amount of the heat curing agent can be easily determined by routine testing. In general, a suitable amount of organic peroxide type heat curing agents ranges from about 0.01 to 5 parts by weight per 100 parts by weight of the thermosetting resin and a suitable amount of the heat curing agent for epoxy resins ranges from about 1 to about 50 parts by weight per 100 parts by weight of the thermosetting resin. Specific examples of suitable heat curing agents which can be used in the surface layers are various organic peroxides, as radical generators, such as benzoyl peroxide, lauroyl peroxide, acetyl peroxide, methyl ethyl ketone peroxide, cyclohexanone peroxide, t-butyl hydroperoxide, p-menthane hydroperoxide, cumene hydroperoxide, di-t-butyl peroxide, dicumyl peroxide, 2,5-dimethyl-2,5-di(t-butyl peroxy)hexane, t-butyl perbenzoate, t-butyl peracetate and di-t-butyl perphthalate; azobisisobutyronitrile; curing agents for epoxy resins such as diethylene triamine, triethylene tetramine, benzyl methyl amine, tris(dimethylaminomethyl)phenol, meta-phenylenediamine, diaminodiphenylmethane, diaminodiphenylsulfone, dicyandiamide, boron trifluoride monoethylamine, menthadiamine, phthalic anhydride, maleic anhydride, hexahydrophthalic anhydride, Nadic Methyl Anhydride (trademark of Allied Chemical for methylbicyclo[2,2,1]heptene-2,3-dicarboxylic anhydride), pyromellitic anhydride, chlorendic anhydride; and curing agents for phenolic resins or melamine resins, such as hexamethylene tetramine, zinc sulfate, $\alpha,\alpha'$-dichlorohydrin, sodium bisulfate, dimethyl oxalate, ethylamine hydrochloride, triethylamine, formic acid, p-toluenesulfonic acid, boric acid, and calcium hydroxide. These heat curing agents may be used individually or as mixtures of two or more thereof. Suitable combinations of these heat curing agents can be selected depending on the type of thermosetting resin.

A suitable amount of the heat curing agent is at least about 0.01 part by weight, preferably 0.1 to 5 parts by weight, per 100 parts by weight of the thermosetting resin. A heat curing agent for epoxy resins may sometimes be added in an amount of as large as 50 parts by weight per 100 parts by weight of the epoxy resin. Thus, the amount of the heat curing agent cannot be set forth unequivocally since such will be dependent on the nature of the thermosetting resin employed.

The desired properties of the sheet, such as fire retardancy, thermal stability, mechanical strength, electrical characteristics, low cost, and aesthetic appearance, can be met by appropriately choosing the composition of the resin containing the short fiber material or inorganic filler.

The term "irradiation with light" as used in the description of this invention denotes irradiation with light having a wavelength of about 200 m$\mu$ to about 800 m$\mu$. Suitable light sources which can be used include, for example, sunlight, a xenon lamp, a carbon arc, a metal halide lamp, a chemical lamp, a high pressure mercury lamp, and a superhigh pressure mercury lamp. A high pressure mercury lamp and a chemical lamp are preferred as the light source.

A suitable amount of irradiation with light will be dependent upon the composition of the interlayer (1), the kind of photocuring agent employed, the thickness of the sheet molding material, whether the irradiation is prior to providing the surface layer (2), etc. The amount of the irradiation which is necessary can be easily determined by routine testing.

The flow of the sheet molding material comprising the interlayer (1) cured by irradiation with light and both uncured surface layers (2) is inhibited under pressure and heat in the subsequent molding step because the interlayer (1) has been cured to some extent. Even when the surface layers (2) flow, the thickness of the interlayer (1) is retained. In this way, press-forming can be conducted without using a mold, a spacer, etc., and, therefore, the resulting sheet molding material has superior multi-stage press-formability.

The flowability of the interlayer (1) at the time of press-forming is determined mainly by the degree of curing of the interlayer (1). The degree of curing of the interlayer (1) can be controlled as desired by appropriately selecting a suitable light irradiation time with regard to the photocuring agent used and the photopolymerizable resin used. In other words, control of flowability is very easy, and accurate. The thickness of the interlayer (1) and the surface layers (2) of the sheet molding material of the present invention will be dependent upon the ultimate end use desired. Thus, where an interlayer of a thickness of about 1 to about 5 mm is employed and the surface layers (2) have a thickness of about 0.1 to 0.3 mm, the flowability resulting of the sheet molding material of this invention is substantially the same as that of the interlayer (1) less any minor contribution to flowability due to the surface layers (2). Where a sheet molding material of this invention comprises an interlayer of a thickness of about 0.5 mm with surface layers (2) of a thickness of about 1 mm, the flow ratio or flowability will be larger since the surface layers (2) are not cured, even though the interlayer is photocured. Flowability of the sheet molding material of the present invention can be expressed by the flow ratio defined below.

$$\text{Flow Ratio} = \frac{\text{Weight of Flash after Molding}}{\text{Weight before Molding}} \times 100$$

A preferred flow ratio is about 0.5 to about 10%. If the flow ratio is too low, the surface condition of the molded article obtained is poor, and the appearance of the article is unsatisfactory for marketing. On the other hand, if the flow ratio is too high, the unit cost of production is high, and extra work is required for removing the flash. Furthermore, when resin which has flowed adheres to the surface of the press, work to remove it is necessary. Hence, the productivity is reduced. Furthermore, when a different kind of a thin film is to be laminated to the surface layer(s) of the sheet molding material, creases and distortion may occur in the thin film. If the flow ratio is too high, the desired thickness accuracy cannot be obtained, and unacceptable products are formed. Accordingly, easy and accurate control of the flow ratio is an essential condition for increasing working efficiency in multi-stage press-forming, and obtaining a sheet having a good thickness accuracy.

The uncured surface layers (2) flow at the time of press-formation, and the heat curing agent acts for the first time during the press-forming to cure the thermosetting resin in the surface layers (2). These surface layers (2) are essential as layers which impart or increase adhesive strength at the time of laminating a different kind of a thin film to the surface layer(s) of the sheet molding material. If a suitable thermosetting resin composition is used, there is no need to use an adhesive between the surface of the sheet molding material and the different thin film. These surface layers are also necessary since when flow occurs, the surface can be smoothened. When these surface layers are made of a thermosetting resin which is non-tacky at room temperature (e.g., about 10°–30° C.), a different kind of thin film which is not self-supporting can be laminated uniformly to the surface layer(s) of the sheet molding material without creases occurring, and a sheet molding material having very good storability and handleability can be obtained.

A suitable thickness for the surface layers (2) which can be employed in this invention, while not limiting, generally ranges from about 0.01 mm to about 2 mm, preferably 0.05 to 0.5 mm.

The term "uncured state" as used in the description of the present invention denotes a state where no curing has occurred or a state where curing has occurred to a very low degree, e.g., 10% or less. Specifically, an "uncured" layer is soluble in at least one of dioxane, chloroform and tetrahydrofuran, e.g., to the extent no substantially insoluble materials can be detected at room temperature.

As stated hereinabove, the flow ratio in the sheet molding material of this invention can be controlled by adjusting the degree of curing and the thickness of the uncured surface layers (2) on the basis of the combination of the cured interlayer (1) and the uncured surface layers (2), and a sheet having a good thickness accuracy can be obtained. The lamination of a different kind of thin film to the sheet molding material of this invention can be accomplished easily and the sheet molding material of this invention is especially suitable for multi-stage press-forming.

When a different kind of thin film is to be laminated to only one surface (2) of the sheet molding material, the other surface layer (2) may also contain a photocuring agent and a photopolymerizable resin, e.g., as described above for the interlayer (1), thereby to form a sheet molding material in which only that surface layer (2) to which the different film has been laminated is maintained in an uncured state. Since one surface layer (2) is photocured in this case, the sheet molding material is easy to handle, and has the advantage that use of a releasing sheet is not required on the cured surface layer (2). A suitable amount of the photopolymerizable resin which can be present in the surface layers (2) described above ranges from about 1 to 99% by weight of the photopolymerizable resin and about 0.01 to 1% by weight of the photocuring agent, each based on the total weight of the compositions for the surface layer (2).

The sheet molding material in accordance with this invention in which the interlayer (1) contains a photocuring agent but does not contain a heat curing agent has additional superior advantages. Specifically, since the interlayer (1) does not contain a heat curing agent and, thus, is stable to heat, all methods of molding utilizing heat can be used.

Press-forming, extrusion, and calendering can be ulitized in conventional sheet molding processes. However, only a press-forming method has been employed with thermosetting resins, because conventional thermosetting resins contain a heat curing agent. Therefore, when an extrusion method or a calendering method, which is a continuous molding method utilizing heat, is employed, the thermosetting resins cure during the processing and the operation must be stopped halfways. In particular, sheets having a thickness of about 1 to 2 mm and a width of about 1,000 mm have never been produced commercially by the extrusion process using thermosetting resins. The present invention has overcome this drawback, and has made it possible to produce thermosetting resin sheet molding materials continuously using a sheet die and an extruder as in the case of thermoplastic resins. A suitable temperature at which the curing of the thermosetting resin present in the surface layers (2) of the embodiments of this invention can be accomplished ranges from about 50° to about 200° C., preferably 120° to 180° C.

Thus, the present invention also provides a process for continuously producing a sheet molding material, which comprises extruding an interlayer (1) as a sheet-like material using an extruder and a sheet die, adhering a separately prepared surface layer (2) to both surfaces of the interlayer (1), and irradiating the resulting assembly with light. The invention also provides a modification of the above process in which the interlayer (1) does not contain a heat curing agent but a continuous-phase base material is included in the two surface layers (2). Since the interlayer (1) does not contain a heat curing agent, the interlayer (1) is stable to heat. Hence, there is no likelihood of curing the interlayer (1) during the extrusion, and even when the process is operated for long periods of time, a molded sheet having a good thickness accuracy can be obtained in a stable manner and with high productivity. By adhering a thermosetting resin surface layer (2) containing a heat curing agent to both surfaces of the resulting interlayer (1), the sheet molding material of this invention can be obtained continuously. By irradiating both surfaces of the assembly with light, a sheet molding material where only the interlayer (1) has been cured can be obtained.

The sheet molding material may be cut to the desired size prior to subjecting the sheet molding material to multi-stage press-forming. Further, by directly passing the sheet molding material through, for example, a double steel belt press, and curing the sheet molding material after, if desired, a different kind of thin film is applied to the sheet molding material, a flat plate of thermosetting resin which has a very good thickness accuracy can be produced. This method is labor-saving, and has unprecedented high productivity.

The interlayer (1) of the sheet molding material of the invention is desirably solid at room temperature. The composition for the interlayer (1) is kneaded, and then granulated or pelletized before extrusion. Extrusion can be performed using an ordinary monoaxial or biaxial extruder. The temperature should be preset at a point at which the composition for the interlayer (1) has a viscosity which permits the easiest extrusion. Usually, a suitable temperature is about 50° to 140° C., and should be as low as possible. A suitably viscosity which permits easy extrusion will range from about $10^3$ to about $10^6$ poise, preferably $10^4$ to $10^5$ poise, at the temperature of extrusion.

The surface layer (2) which can be most suitably employed in this method is a material obtained by impregnating a continuous-phase base material with a thermosetting resin which is non-tacky at room temperature. The impregnated material can be applied continuously to both surfaces of a continuously extruded interlayer (1), e.g., by using pinch rolls. In particular, continuous-phase base materials of the glass fiber type inhibit transmission of light only to a small extent, and can be sent to a successive light irradiating step.

In this case, too, when a photocuring agent and a photopolymerizable resin are added to one surface layer (2), a sheet molding material in which only one surface layer (2), is in an uncured state can be obtained.

When the resin composition of the interlayer (1) does not contain a heat curing agent, the resin composition is a composition which contains a photocuring agent and a photopolymerizable resin and, as optional components, a short fiber material, an inorganic filler and other additives. The combination of these components must be appropriately selected from those exemplified above. For example, a combination of components which will be cured during extrusion molding cannot be used for the interlayer (1). If a certain resin composition composed of a combination of a photocuring agent and a photopolymerizable resin is tested at 60 rpm and 160° C. by a Brabender Roller Mixer and does not cure within a period of at least 1.5 hours, preferably at least 2 hours, the resin composition of the interlayer (1) can be extrusion-molded sufficiently at least at about 120° C. or less.

Compositions which can actually be used in extrusion molding preferably contain photocuring agents of the benzoin, benzophenone and anthraquinone types. Specific examples of these types of photocuring agents include benzoin methyl ether, benzoin ethyl ether, benzoin isopropyl ether, benzoin butyl ether, benzophenone, 4,4'-bis(dimethylamino)benzophenone, 4,4'-bis(diethylamino)benzophenone, anthraquinone, 2-methylanthraquinone, 2-ethylanthraquinone, 2-t-butylanthraquinone, and 1-chloroanthraquinone. Preferred photopolymerizable resins are combinations of unsaturated polyester prepolymers or diallyl phthalate prepolymer with dimethyl fumarate, vinyl toluene, diallyl phthalate, diallyl maleate or triallyl cyanurate. Generally, compounds containing an acryloyl or methacryloyl group tend to be cured by the heat encountered during extrusion molding, e.g., due to a temperature of above 120° C., and can be added to the resin composition only in an amount of about 5% by weight or less. However, compounds having a high molecular weight per acryloyl or methacryloyl group, such as polyethylene glycol diacrylate or dimethacrylate with a degree of polymerization n of $n \geq 6$ can be used in an amount of more than about 5% by weight whether they are monomers, or prepolymers (for example, unsaturated epoxy resins, unsaturated polyurethanes, unsaturated polyamides, etc.).

When the extrusion molding is carried out at a temperature of as low as about 60° C., the likelihood of heat curing can be reduced. Hence, usable resin compositions for the interlayer (1) can be screened by performing the Brabender test described above at a temperature of 120° C., and the range of selection of the resin composition for the interlayer (1) can be broadened.

In another embodiment, the invention also provides a sheet molding material with surface layers (2) containing a continuous-phase base material. The continuous-phase base material should not impair the transmission of light when the surface layers (2) are first adhered to the interlayer (1) and then the resulting assembly is irradiated with light. However, when the interlayer (1) is first photocured and then the surface layers (2) are adhered, all kinds of base materials, i.e., transparent and opaque, can be used. Those continuous-phase base materials which can generally be used in the invention are, for example, glass cloth, non-woven glass cloth, glass paper, paper, asbestos paper, papers formed from a mixture of cellulose and other fibrous material, synthetic fiber cloth, synthetic fiber non-woven cloth, synthetic paperlike sheets, glass mats, felts, and nets. In particular, woven cloths of glass fibers are superior because they have high rigidity and improved dimensional stability to warping, twisting and temperature changes when they are formed into a large-size flat plate. Papers are inexpensive, and most suitable for reducing the cost of the sheet molding material. In this way, continuous-phase base materials of different kinds can be selected depending on the desired purpose. A thermosetting resin layer containing a continuous-phase base material is prepared by coating a thermosetting resin containing a heat curing agent on the continuous-phase base material, or melting and impregnating the thermosetting resin in the continuous-phase base material, or impregnating the continuous-phase base material with a solution of the thermosetting resin and removing the solvent by drying. The sheet molding material of the invention can be produced by adhering the resulting resin layer to both surfaces of the interlayer (1). The sheet molding material containing a continuous-phase base material in the surface layers (2) thereof produced in this manner has improved flexural modulus and dimensional stability, can be easily handled, and permits increased operating efficiency. When this type of sheet molding material is formed into a thin large-size flat plate, a marked prevention of warping or twisting is achieved.

In an even further embodiment, the invention also provides a sheet molding material having a metal layer laminated on at least one of the surface layers (2). Metals which can be used in this embodiment include copper, aluminum, nickel and silver, and of these metals, copper is preferred. The thickness of the metal layer is not limited but generally ranges from 5 to 70 μm. The metal layer can be laminated on the sheet molding material in a conventional manner.

The sheet molding material described hereinabove can be produced, for example, by the following method.

A photopolymerizable resin containing a photocuring agent is kneaded, optionally together with a thermosetting resin containing a heat curing agent, a short fiber material, an inorganic filler, a viscosity stabilizer, a pigment and other additives, and the mixture is formed into an interlayer sheet using, for example, a press-forming method, a casting method, a roll method, etc.

Then, a thermosetting resin containing a heat curing agent is mixed, optionally with a short fiber material, an inorganic filler and other additives, and the resulting mixture is formed into a sheet by similar means. The surface layer sheet thus produced is adhered to both surfaces of the interlayer sheet produced earlier. At this time, one of the surface layers may, if desired, contain a photopolymerizable resin containing a photocuring agent.

Both surfaces of the resulting three-layer sheet molding material are irradiated with light to cure the interlayer (1) containing a photocuring agent and a photopolymerizable resin.

Alternatively, the interlayer (1) may be first irradiated with light prior to adhering the surface layers (2), and then both surface layers (2) may be adhered to the cured interlayer (1). This method is especially advantageous when the interlayer (1) is to be made of a liquid resin because light irradiation can be used to produce a solid interlayer sheet that is easy to handle, as stated hereinabove.

When the interlayer (1) is non-tacky at room temperature, the surface layers (2) can be obtained by merely coating the interlayer (1) without forming sheets of the composition for the surface layer (2). Particularly, a sheet obtained by curing the interlayer (1) by irradiation with light can be coated with a liquid thermosetting resin containing a heat curing agent, or a solvent solution of the thermosetting resin and the heat curing agent followed by removing the solvent, thereby to form an uncured surface layer (2) on both surfaces of the interlayer (1).

Since different kinds of film have good adhesion to the sheet molding materials obtained by the present invention, the sheet molding materials are suitable for multi-stage press-forming without using a special mold or a spacer, and can be used to produce sheets having a good thickness accuracy. The sheet molding materials of this invention are useful for various panels or boards, decorative sheets, electric insulation sheets, laminated sheets, and printed circuit base boards.

The following Examples are given to illustrate the present invention more specifically. However, it should be understood that the invention is in no way limited by these Examples. All parts and percentages in these Examples are by weight.

EXAMPLE 1

(a) A composition, non-tacky at room temperature, was prepared by blending 100 parts of an unsaturated polyester prepolymer having a degree of condensation of 40 obtained from a mixture of dimethyl terephthalate and maleic anhydride (50:50 mol%) and ethylene glycol, 30 parts of vinyltoluene, 65 parts of calcium carbonate and, as a photocuring agent, 1 part of benzoin ethyl ether. The composition was press-formed at 90° C. using a spacer to produce a plate having a size of 20 cm×20 cm with a thickness of 2 mm.

(b) Fifty parts of an unsaturated polyester resin composition as described above but which did not contain benzoin ethyl ether, but rather as a heat curing agent, 2 parts of dicumyl peroxide, was dissolved in 150 parts of chloroform to form a dope. A glass cloth having a basis weight of 110 g/m$^2$ was immersed in the resulting dope. The chloroform was evaporated to form a heat curing agent and thermosetting resin-containing layer. The thickness of the glass cloth in the layer was 150$\mu$, and the thickness of the glass cloth after impregnation was 370$\mu$. The resin pick-up was 250 g/m$^2$.

(c) The resin-impregnated glass cloth produced in (b) above was adhered to both surfaces of the plate produced in (a) above (with a size of 0.2 cm×20 cm×20 cm) using a press-forming machine at 90° C. to form a sheet molding material.

The sheet molding material was irradiated for 2 minutes with light from a superhigh pressure mercury lamp disposed at a distance of 30 cm from the sheet molding material. An uncured layer having a thickness of about 300$\mu$ was present on both surfaces of the cured interlayer. (This was examined by immersing the sheet molding material thus-obtained in chloroform to dissolve the uncured layers.)

(d) The photocured sheet molding material was cured by pressing it at 50 kg/cm$^2$ and 160° C. for 30 minutes using a press-forming machine without using a spacer.

(e) As a comparison, a similar sheet molding material was prepared but in which the interlayer did not contain benzoin ethyl ether, and then heat cured.

The results obtained for the sheet molding material and the comparative sheet molding material are tabulated below.

|  | Example 1 | Comparison |
| --- | --- | --- |
| Thickness before Molding (mm) | 2.6 | 2.6 |
| Thickness after Molding (mm) | 2.5 | 1.7 |
| Thickness Accuracy* after Molding (mm) | 0.1 | 0.8 |
| Flow Ratio (%) | 4 | 30 |

*The thickness accuracy is the value obtained by subtracting the minimum thickness of the molded material from the maximum thickness of the molded material.

EXAMPLE 2

(a) A liquid composition of 60 parts of an unsaturated polyester prepolymer having a molecular weight of about 2,000 obtained by condensing o-phthalic acid (50 mol%), maleic anhydride (50 mol%) and propylene glycol (102 mol%) (Polylite FH-103, a trademark of Japan Reichhold Chemical Inc.), 40 parts of styrene and, as a photocuring agent, 1 part of 2-ethylanthraquinone, was poured to a thickness of 3 mm between two glass plates having a size of 25 cm×25 cm with a glass chopped strand mat (400 g/m$^2$) interposed between the glass plates. The resulting assembly was then irradiated for 1 min. with light from a superhigh pressure mercury lamp disposed 30 cm away from the assembly.

(b) Separately, 50 parts of a 40:60 by weight mixture of a bisphenol-type unsaturated polyester prepolymer (ATLAC 382 A, a trademark of ATLAS, comprising the reaction product of bisphenol A, propylene glycol and fumaric acid; mol. wt.: about 2,500) and an unsaturated epoxy resin (a dimethacrylate-terminated bisphenol-type epoxy resin having an epoxy value of 450), 1 part of di-t-butyl peroxide, as a heat curing agent, and 50 parts of kaolin were dissolved in 100 parts of methyl ethyl ketone. The resulting solution was coated on both surfaces of the photocured sheet obtained as described in (a) above, and the solvent was removed by drying. The coated surface layer had a thickness of 0.2 mm.

(c) The resulting sheet molding material was pressed for 20 minutes using a press-forming machine at 170° C. and 30 kg/cm$^2$ without using a spacer. The resulting cured sheet had a thickness of 3.2 mm, a thickness accuracy of 0.1 mm, and a flow ratio of 5%.

EXAMPLE 3

(a) Fifty parts of a diallyl phthalate prepolymer having an iodine value of 60, 5 parts of diallyl phthalate monomer, 2.5 parts of trimethylolpropane triacrylate, 0.5 part of benzophenone, as a photocuring agent, 100 parts of aluminum hydroxide and 25 parts of polyvinyl alcohol staple fibers were kneaded using a mixing roll, and the mixture was formed by a press into a sheet having a thickness of 3.5 mm and a size of 30×30 cm.

(b) Then, 50 parts of the diallyl phthalate prepolymer as described above, 7.5 parts of diallyl phthalate monomer and 1 part of methyl ethyl ketone peroxide as a heat curing agent were dissolved in 100 parts of acetone. A polyester non-woven fabric (70 g/m$^2$) was impregnated with this solution and dried to remove the acetone. The resulting impregnated sheet was adhered to both surfaces of the press-formed sheet produced as described in (a) above to obtain a sheet molding material.

(c) Both surfaces of the sheet molding material were irradiated for 2 minutes with light from a xenon lamp positioned 20 cm away from the sheet molding material. Each of the surface layers had a thickness of about 0.4 mm.

(d) The sheet material was press-formed for 20 minutes at 160° C. and 75 kg/cm$^2$ without using a spacer. The resulting cured sheet had a thickness of 4.5 mm, a thickness accuracy of 0.15 mm and a flow rate of 7%.

EXAMPLE 4

(a) A sheet having a thickness of 1.5 mm and a size of 20×20 cm was prepared using 100 parts of an unsaturated epoxy resin obtained from a bisphenol A-type epoxy resin having an epoxy rquivalent of 900 and 1.5 mols, per mol of the epoxy resin, of acrylic acid, 20 parts of Nadic Methyl Anhydride, as a heat curing agent, and 2 parts of benzoin methyl ether, as a photocuring agent.

(b) Separately, 100 parts of a bisphenol A-type epoxy resin having an epoxy equivalent of 500 and 3 parts of dicyandiamide, as a heat curing agent, were dissolved in a mixture of 150 parts of methyl ethyl ketone and 50 parts of dimethylformamide. A glass cloth (203 g/m$^2$) was impregnated with the solution and dried to remove the solvent (the resin pick-up was 110 g/m$^2$).

(c) The resulting impregnated glass cloth produced in (b) above was adhered to both surfaces of the sheet produced in (a) above. Each surface of the assembly was irradiated for 1 minute with light from a superhigh pressure mercury lamp disposed 5 cm away from the sheet molding material.

(d) The resulting sheet molding material had an uncured layer having a thickness of 0.3 mm on both surfaces thereof. When the sheet molding material was press-formed for 1 hour at 180° C. and 100 kg/cm$^2$ without using a spacer, the product obtained had a thickness of 1.65 mm, a thickness accuracy of 0.05 and a flow ratio of 3%.

EXAMPLE 5

(a) A composition of 100 parts of an unsaturated polyester prepolymer (ATLAC 363 E, a trademark of ATLAS, reaction product of bisphenol A, ethylene glycol, fumaric acid + unidentified glycol; mol. wt. about 3,000), 10 parts of 1,4-butanediol diacrylate, 100 parts of bisphenol A-type epoxy resin (epoxy equivalent: 900), 5 parts of a boron trifluoride-monoethylamine complex, as a heat curing agent, 2 parts of benzoin butyl ether as a photocuring agent, 200 parts of silica powder, and 20 parts of chopped strand glass fibers (3 mm) was kneaded for 20 minutes in a kneader at 100° C. The mixture was then formed with a press-forming machine at 100° C. using a spacer into a sheet having a thickness of 2 mm and a size of 20 cm×20 cm.

(b) Separately, 30 parts of the unsaturated polyester prepolymer described in (a) above, 70 parts of an unsaturated epoxy resin (a diacrylate of fire retardant epoxy resin, AER 714, a product of Asahi Chemical Ind., Co., Ltd.; epoxy equivalent: 600) and 2 parts of 2,5-dimethyl-2,5-di(t-butylperoxy)hexane, as a heat curing agent, were dissolved in 150 parts of methyl ethyl ketone. A glass cloth (125 g/m$^2$) was impregnated with the solution and dried in an oven at 80° C. (resin pick-up: 100 g/m$^2$).

(c) Additionally, 1 part of benzoin butyl ether was added as a photocuring agent to the methyl ethyl ketone solution described above. An impregnated glass cloth was prepared in a similar manner as described above using this solution.

(d) The two types of glass cloths produced in (b) and (c) above were adhered to both surfaces of the above sheet by a press at 100° C.

(e) For comparison, a sheet molding material having a photocuring agent-containing resin impregnated glass cloth adhered to both surfaces of the above sheet was prepared.

(f) Each of the two sheet molding materials was irradiated for 5 minutes with light from chemical lamps disposed 5 cm away from both surfaces.

The sheet molding material in accordance with this invention had an uncured layer having a thickness of 0.2 mm. The sheet for comparison did not contain an uncured layer.

(g) A copper foil was superimposed on each of the sheet molding materials (in the case of the sheet molding material in accordance with this invention, the copper foil was superimposed on the uncured surface layer), and press-formed for 30 minutes at 170° C. and 30 kg/cm$^2$ without using a spacer.

The copper-clad laminated sheets had the properties tabulated below.

| Properties | Example 5 | Comparison |
|---|---|---|
| Thickness of Uncured Surface Layer (mm) | 0.2 | 0 |
| Thickness of Material before Curing (mm) | 2.4 | 2.4 |
| Thickness after Curing (mm) | 2.3 | 2.4 |
| Thickness Accuracy (mm) | 0.05 | 0.1 |
| Flow Ratio (%) | 2.0 | <0.5 |
| Flexural Modulus (kg/mm$^2$)* | 2540 | 2710 |
| Flexural Strength (kg/mm$^2$)* | 22.1 | 22.4 |
| Insulation Resistance* | | |
|   Normal Conditions (ohms) | 1 × 10$^{15}$ | 1 × 10$^{15}$ |
|   After Boiling (ohms) | 6 × 10$^{11}$ | 7 × 10$^{11}$ |
| Copper Foil Delamination Strength (Kg/cm)* | 2.2 | 0.4 |
| Solder Heat Resistance (sec)* | 85 | 7 |

*JIS C6481

It can be seen from these results that the product of this Example had a higher copper foil delamination strength and far higher solder heat resistance than the product for comparison.

EXAMPLE 6

(a) Twenty parts of an unsaturated polyester prepolymer as described in (a) of Example 1, 3 parts of diallyl phthalate, 2 parts of pentaerythritol tetraacrylate, 0.4 part of benzoin isopropyl ether, as a photocuring agent, 5 parts of powdered polyethylene, 55 parts of calcium silicate, and 15 parts of glass chopped strands (6 mm)

were blended, and kneaded at 90° C. in a biaxial extruder to pelletize the mixture.

A coat hanger-type sheet die having a width of 350 mm was fitted to a 30 $\phi$ monoaxial extruder, and the pellets were extruded continuously into a sheet having a thickness of 2 mm under the following conditions.
Barrel Temperature: 90° C.
Die Temperature: 92° C.
Pressure: 110 kg/cm$^2$
Rate of Extrusion: 12 kg/hr (b) Separately, 20 parts of the same unsaturated polyester prepolymer as described in (a) of Example 1, 5 parts of diallyl phthalate and 0.5 part of cumene hydroperoxide, as a heat curing agent, were dissolved in 30 parts of dioxane. A glass cloth (203 g/m$^2$) was impregnated with this solution to form an impregnated glass cloth having a thickness of 0.3 mm and a resin pick-up of 115 g/m$^2$.

(c) The impregnated glass cloth was adhered to both surfaces of the extrusion-molded sheet obtained as described above using a pair of pinch rolls provided at the exit of the sheet die, and thus, a sheet molding material was continuously produced.

The sheet molding material was subsequently passed through a pair of high pressure mercury lamps disposed vertically, and irradiated with light with the distance between each surface of the material and each mercury lamp being maintained at 20 cm. The irradiation width of the high pressure mercury lamp was 20 cm, and the rate of sheet travel was 15 cm/min. The resulting sheet molding material had a 0.3 mm thick uncured layer on both surfaces thereof, and a thickness of 2.55 mm±0.005 mm.

After operating the machine continuously for 8 hours, the joint portion between the extruder and the die attained a temperature of 120° C., but this caused no inconvenience in the operation.

(d) The sheet molding material was cut to a length of 35 cm, and the cut piece was press-formed for 30 minutes at 150° C. and 75 kg/cm$^2$ without using a spacer. The press-formed sheet had a flow ratio of 2%, and after curing had a thickness of 2.5 mm±0.03 mm.

(e) For comparison, 0.1 part of cumene hydroperoxide as a heat curing agent was added to the resin composition described in (a) above for an interlayer, and the resulting composition was extruded under the same conditions as described above. In 2 hours, the composition cured, and could not be extruded further.

EXAMPLE 7

(a) A powdery mixture of 10.5 parts of an unsaturated polyester prepolymer having a degree of condensation of 38 obtained by reacting equimolar amount of a mixture (50:50 mol%) of dimethyl terephthalate and fumaric acid and a mixture (90:10 mol%) of ethylene glycol and propylene glycol, 3 parts of diallyl phthalate monomer, 12 parts of a half ester of methacrylic acid and a fire retardant epoxy resin (AER 714, a product of Asahi Chemical Ind. Co. Ltd., epoxy equivalent: 600; bromine content: 24 wt%), 0.4 part of benzoin ethyl ether, as a photocuring agent, 4.5 parts of polypropylene powder (passing 50 mesh, Flowblen B-200, a trade name of Seitetsu Chem. Ind.), 60 parts of heat treated aluminum hydroxide described in Example 2 of Japanese Patent Application (OPI) No. 133339/76, 10 parts of chopped glass strands (3 mm), and 1 part of antimony trioxide (particle size: about 0.2 to 5$\mu$) was mixed in a mixer. A strand die and a hot cutter were secured to the end of a biaxial extruder, and the resulting mixture was kneaded in the extruder at 95° C. at an extrusion rate of 200 kg/hr to form pellets.

A coat hanger-type sheet die having a width of 1,200 mm was fitted to a 90 $\phi$ monoaxial extruder, and the pellets were extruded into a sheet having a thickness of 1.3 mm and a width of 1,185 mm under the following conditions.
Temperature of Resin Extruded: 105° C.
Pressure at Inlet of Die: 75 kg/cm$^2$
Rate of Extrusion: 180 kg/hr
Speed of Sheet: 1.3 m/min (b) Separately, 30 parts of a bisphenol-type unsaturated polyester prepolymer (ATLAC 363E, a trademark of ATLAS, reaction product of bisphenol A, ethylene glycol, fumaric acid + unidentified glycol; mol. wt.: about 3,000), 70 parts of the half methacrylate of a fire retardant epoxy resin described in (a) above, and, as a heat curing agent, 1.5 parts of dicumyl peroxide and 2 parts of a boron trifluoridemonoethylamine complex were dissolved in 80 parts of toluene and 20 parts of methyl ethyl ketone. A glass cloth (203 g/m$^2$) was impregnated with the resulting solution and dried to remove the solvent. The resulting impregnated glass cloth having a resin pick-up of 110 g/m$^2$ was taken up.

(c) The impregnated glass cloth was adhered to both surfaces of the sheet produced in (a) by pinching it with a pair of 300 $\phi$ cooling rolls at about 18° C. provided immediately rearward of the sheet die. The resulting sheet molding material had a thickness of 1.7±0.1 mm.

The resulting sheet assembly was passed over a 5 m roller table to cool the assembly to room temperature in the air. Then, the assembly was passed between three pairs of high pressure mercury lamps (length 1400 mm; 80 w/cm) while maintaining a distance of 300 mm from the lamps. The resulting sheet molding material had a 0.2 mm-thick uncured layer on both surfaces thereof.

(d) The sheet molding material was cut into a piece with a width of 1040 mm and a length of 1060 mm. A 35 $\mu$-thick copper foil was superimposed on one surface of the cut piece. Ten such assemblies were made one stage, and 20 such stages were press-formed by a 20-stage press-forming machine at 70 kg/cm$^2$. In the press-forming process, the temperature was increased from room temperature to 160° C. over the course of 15 minutes, the material was maintained at 160° C. for 30 minutes, and then cooled to room temperature over the course of 15 minutes. The properties of the resulting copper-clad laminated plate were as follows:
Thickness and Accuracy (mm) : 1.62±0.02
Flow Ratio (%) : 2
Copper Foil Delamination Strength (kg/cm) : 1.8
Solder Heat Resistance (sec) : 93
Heat Resistance (30 min.) (°C.) : 250
Flexural Strength (kg/mm$^2$) : 28.2
Warping (%) : 1.1
Twisting (%) : 2.0
Insulation Resistance (ohms) : 3.5×10$^{14}$
Dielectric Constant (1 MHz) : 4.8
Dielectric Loss Tangent (1 MHz) : 0.024
Arc Resistance (sec) : 189

EXAMPLE 8

(a) A sheet having a thickness of 1.3 mm was prepared from a composition comprising 20 parts of an unsaturated polyester prepolymer having a molecular weight of about 3,500 obtained from isophthalic acid (50 mol%), maleic acid (50 mol%), propylene glycol (60 mol%) and neopentyl glycol (40 mol%), 5 parts of diallyl phthalate monomer, 4 parts of melamine resin, 0.1 part of hexamethylene tetramine, 10 parts of glass fibers (6 mm), 60 parts of an inorganic filler (obtained by heat treating aluminum hydroxide at 300° C. for 4 hours; as described in Example 3 of Japanese Patent Application (OPI) No. 133339/76), and 0.3 part of benzoin ethyl ether.

(b) A glass cloth (203 g/m$^2$) was impregnated with a resin solution comprising 30 parts of a diallyl isophthalate prepolymer having an iodine value of 90, 0.6 part of cyclohexanone peroxide and 70 parts of methyl ethyl ketone, and dried to remove the solvent to a pick-up of 120 g/m$^2$.

(c) The impregnated glass cloth was adhered to both surfaces of the sheet produced as described in (a) above, and both surfaces of the assembly was irradiated for 3 minutes with light from six 20 w chemical lamps.

(d) The resulting sheet molding material had a 0.15 mm-thick uncured layer on both surfaces thereof with a photo-cured interlayer. The sheet molding material was pressed for 20 minutes at 170° C. and 50 kg/cm$^2$ to form an electrical insulation sheet having a thickness of 1.6 mm. The properties of the electrical insulation sheet were as follows:

| | | |
|---|---|---|
| Thickness and Accuracy (mm): | 1.59 ± 0.05 | |
| Flow Ratio (%): | 1.5 | |
| Flexural Strength (kg/mm$^2$): | 32 | JISC 6481 |
| Insulation Resistance (ohms): | | JISC 6481 |
| Normal Condition: | 2 × 10$^{15}$ | |
| After Boiling: | 4 × 10$^{11}$ | |
| Arc Resistance: | 187 | |
| Tracking Resistance (V): | 500 OK | (IEC method) |
| Dielectric Break-down Voltage (KV/mm): | 20 | JISC 6481 |
| Fire Retardancy: | 94 V-0 | (UL standard) |

While the invention has been described in detail and with reference to specific embodiments thereof, it will be apparent to one skilled in the art that various changes and modifications can be made therein without departing from the spirit and scope thereof.

What is claimed is:

1. A sheet molding material comprising (1) an interlayer containing a photopolymerizable resin and a photocuring agent for the photopolymerizable resin and (2) a surface layer of a thermosetting resin containing a heat curing agent for the thermosetting resin on both surfaces of the interlayer (1).

2. The sheet molding material of claim 1, wherein the interlayer (1) is a light-irradiation cured interlayer.

3. The sheet molding material of claim 1, wherein one of the surface layers (2) additionally contains a photopolymerizable resin and a photocuring agent for the photopolymerizable resin.

4. The sheet molding material of claim 3, wherein the interlayer (1) is a light-irradiation cured interlayer and one surface layer (2) is a light-irradiation cured surface layer.

5. The sheet molding material of claim 1, 2, 3 or 4, wherein said interlayer (1) and said surface layer (2) additionally contain at least one of a short fiber material and an inorganic filler.

6. The sheet molding molding material of claim 1, 2, 3 or 4, wherein the interlayer (1) is free of a heat curing agent.

7. The sheet molding material of claim 5, wherein the interlayer (1) is free of a heat curing agent.

8. The sheet molding material of claim 1, 2, 3 or 4, wherein the surface layers (2) additionally contain a reinforcing material.

9. The sheet molding material of claim 5, wherein the surface layers (2) additionally contain a reinforcing material.

10. The sheet molding material of claim 6, wherein the surface layers (2) additionally contain a reinforcing material.

11. The sheet molding material of claim 7, wherein the surface layers (2) additionally contain a reinforcing material.

12. The sheet molding material of claim 8, wherein only the interlayer (1) contains a short fiber material.

13. The sheet molding material of claim 9, wherein only the interlayer (1) contains a short fiber material.

14. The sheet molding material of claim 10, wherein only the interlayer (1) contains a short fiber material.

15. The sheet molding material of claim 11, wherein only the interlayer (1) contains a short fiber material.

16. A metal-clad laminate comprising a metal layer laminated on the sheet molding material of claim 5.

17. A metal-clad laminate comprising a metal layer laminated on the sheet molding material of claim 8.

18. A metal-clad laminate comprising a metal layer laminated on the sheet molding material of claim 9.

19. A metal-clad laminate comprising a metal layer laminated on the sheet molding material of claim 10.

20. A metal-clad laminate comprising a metal layer laminated on the sheet molding material of claim 11.

21. The laminate of claim 16, wherein the metal layer is a layer of copper.

22. The laminate of claim 17, wherein the metal layer is a layer of copper.

23. The laminate of claim 18, wherein the metal layer is a layer of copper.

24. The laminate of claim 19, wherein the metal layer is a layer of copper.

25. The laminate of claim 20, wherein the metal layer is a layer of copper.

26. The sheet molding material of claim 1, wherein said sheet molding material consists of (1) an interlayer of a photopolymerizable resin containing a photocuring agent for the photopolymerizable resin and (2) a surface layer of a thermosetting resin containing a heat curing agent for the thermosetting resin on both surfaces of the interlayer.

27. The sheet molding material of claim 1, wherein said sheet molding material consists essentially of (1) an interlayer of a photopolymerizable resin containing a photocuring agent for the photopolymerizable resin and (2) a surface layer of a thermosetting resin containing a heat curing agent for the thermosetting resin on both surfaces of the interlayer (1).

28. The sheet molding material of claim 27, wherein said interlayer (1) is a light-irradiation cured interlayer.

29. A metal-clad laminate comprising a metal layer laminated on both surface layers (2) of the sheet molding material of claim 27.

30. A metal-clad laminate comprising a metal layer laminated on one of the surface layers (2) of the sheet molding material of claim 27.

31. The sheet molding material of claim 27, wherein the surface layers (2) additionally contain a reinforcing material.

32. This sheet molding material of claim 31, wherein said reinforcing material is a glass cloth and/or paper.

33. The sheet molding material of claim 27, wherein said interlayer (1) additionally contains a short fiber material.

34. The sheet molding material of claim 33, wherein said short fiber material is a glass fiber.

35. The sheet molding material of claim 27, wherein said interlayer (1) additionally contains an inorganic filler.

36. The sheet molding material of claim 35, wherein said inorganic filler is at least one compound selected from the grouop consisting of calcium carbonate, aluminum hydroxide, talc, mica, calcium silicate, silica powder and glass beads.

37. The sheet molding material of claim 1, wherein said interlayer (1) additionally contains a short fiber material and an inorganic filler and said surface layers (2) additionally contain a reinforcing material.

38. A metal-clad laminate comprising a metal layer laminated on one of the surface layers (2) of the sheet molding material of claim 37.

39. A metal-clad laminate comprising a metal layer laminated on both surface layers (2) of the sheet molding material of claim 37.

40. The sheet molding material of claim 30 or 39, wherein said photopolymerizable resin comprises:
 (1) a prepolymer of either:
   (a) an unsaturated polyester, or
   (b) an unsaturated epoxy resin, or
   (c) a mixture thereof, and
 (2) a monomer of either:
   (a) diallyl phthalate, or
   (b) triallyl cyanurate, or
   (c) glycidyl methacrylate, or
   (d) pentaerythritol tetracrylate, or
   (e) a mixture thereof.

41. The sheet molding material of claim 40, wherein said photocuring agent is at least one compound selected from the group consisting of benzoin, benzoin methyl ether, benzoin ethyl ether and benzoin isopropyl ether.

42. The sheet molding material of claim 30 or 39, wherein said thermosetting resin is an unsaturated polyester resin, an unsaturated epoxy resin, a saturated epoxy resin or a mixture thereof.

43. The sheet molding material of claim 42, wherein said heat curing agent is at least one compound selected from the group consisting of dicumyl peroxide, dicyandiamide, benzyl methyl amine, diamino diphenylmethane and boron trifluoride monoethylamine.

* * * * *